United States Patent [19]

Hsue

[11] Patent Number: 6,026,012
[45] Date of Patent: Feb. 15, 2000

[54] DUAL PORT RANDOM ACCESS MEMORY

[75] Inventor: C. C. Hsue, Hsinchu, Taiwan

[73] Assignee: United Microelectronic Corp., Hsinchu, Taiwan

[21] Appl. No.: 09/222,008

[22] Filed: Dec. 30, 1998

[51] Int. Cl.[7] .................................................. G11C 7/00
[52] U.S. Cl. ...................................... 365/154; 365/230.05
[58] Field of Search ............................. 365/154, 230.05, 365/156

[56] References Cited

U.S. PATENT DOCUMENTS 5,307,322  4/1994  Usami et al. ...................... 365/154 X
5,381,363  1/1995  Bazes ................................. 365/154 X
5,742,557  4/1998  Gibbins et al. ..................... 365/154 X

*Primary Examiner*—Do Hyun Yoo
*Attorney, Agent, or Firm*—Hickman Stephens & Coleman, LLP

[57] ABSTRACT

A dual port random access memory (RAM). The dual port random access memory includes four N-MOS transistors and four P-MOS transistors. Both the N-MOS and the P-MOS transistors are used as pass gates. More specifically, two N-MOS transistors are used as pass gate for a set of bit lines and two P-MOS transistors are used as a pass gate to another set of bit lines.

6 Claims, 2 Drawing Sheets

DUAL PORT RANDOM ACCESS MEMORY

BACKGROUND OF THE INVENTION

1. Field of the Invention

The invention relates to a memory device, and more particularly, to a dual port static random access memory (SRAM).

2. Description of the Related Art

As the function of a microprocessor becomes more and more versatile and complex, larger and larger programs or calculations can be operated by the microprocessor. A memory with a large capacity is thus very demanded. How to meet the demand of memory capacity and to fabricate the memories in a lower cost becomes a leading topic in semiconductor manufactures.

According, to the application functions, memories can be categorized into read only memory (ROM) and random access memory (RAM). The read only memory can only perform the read operation, while the random access memory can perform both write and read operations. In terms of data access the read only memory is further categorized into a mask read only memory programmable read only memory (PROM), erasable programmable read only memory (EPROM), and electrically erasable programmable read only memory (EEPROM). Whereas, the random access memory can be further categorized into a static random access memory and a dynamic random access memory (DRAM).

The SRAM is a memory device having the fastest operation speed among the semiconductor memory devices, so that the range of application field is wide. For example, the SRAM can also be applied as a cache memory for computer data access. A typical SRAM cell comprises four transistors and two resistors or six transistors. Compared to other kinds of memory devices, the integration is inferior.

Another dual port SRAM has been developed with a more powerful function of data input/output (I/O) than the above-mentioned single port SRAM. The dual port SRAM typically comprises eight transistors, including six N-type metal-oxide semiconductors (NMOS) NM1 to NM6 and two P-type MOSs (PMOS) PM1 and PM2, as shown in FIG. 1. In addition, two word lines WL1, W12 and four bit lines BL1, $\overline{BL1}$, BL2, $\overline{BL2}$ are required to perform write and read operations. The layout of six NMOSs and two PMOSs is very asymmetric to affect the performance of the dual port SRAM.

SUMMARY OF THE INVENTION

It is an object of the invention to provide a dual port SRAM which employs a symmetric layout to enhance the performance, so as to enhance the packing density.

To achieve the above-mentioned objects and advantages, a dual port SRAM is provided. The dual port SRAM comprises two inverters, two NMOSs, and two PMOSs. The inverters comprise a first inverter with a first input terminal and a first output terminal, and a second inverter with a second input terminal and a second output terminal. The second input terminal is connected to the first output terminal, while the first input terminal is connected to the second output terminal. A first N-type MOS transistor comprises a gate connecting to a first word line, a source/drain region connecting to a first bit line, and the other source/drain region connecting to the first output terminal. A second N-type MOS transistor comprises a gate connecting to the first word line, a source/drain region connecting to a second bit line, and the other source/drain region connecting to the first input terminal. A first P-type MOS transistor comprises a gate connecting to a second word line, a source/drain region connecting to a third bit line, and the other source/drain region connecting to the second input terminal. A second P-type MOS transistor, comprises a gate connecting to the second word line, a source/drain region connecting to a fourth bit line, and the other source/drain region connecting to the second output terminal.

Another dual port static random access memory is further provided by the invention. The dual port static random access memory comprises four P-type MOS transistors and four N-type MOS transistors. A first N-type MOS transistor comprises a gate connecting to a first word line, a source/drain region connecting to a first bit line, and the other source/drain region connecting to a first node. A second N-type MOS transistor comprises a gate connecting to the first word line, a source/drain region connecting to a second hit line, and the other source/drain region connecting to a second node. The third N-type MOS transistor comprises a gate connecting to the second node, a source/drain region connecting to ground, and the other source/drain region connecting to the first node. A fourth N-type MOS transistor comprises a gate connecting to the first node, a source/drain region connecting to ground, and the other source/drain region connecting to the second node. A first P-type MOS transistor comprises a gate connecting to a second word line, a source/drain region connecting to a third bit line and the other source/drain region connecting to the first node. A second P-type MOS transistor, comprises a gate connecting to the second word line, a source/drain region connecting to a fourth bit line, and the other source/drain region connecting to the second node. A third P-type MOS transistor comprises a gate connecting to the second node a source/drain region connecting to the power source, and the other source/drain region connecting to the first node. A fourth P-type MOS transistor comprises a gate connecting to the first node, a source/drain region connecting to the power source, and the other source/drain region connecting to the second node.

Both the foregoing general description and the following detailed description are exemplary and explanatory only and are not restrictive of the invention, as claimed.

DESCRIPTION OF THE PREFERRED EMBODIMENTS

Figure 1:
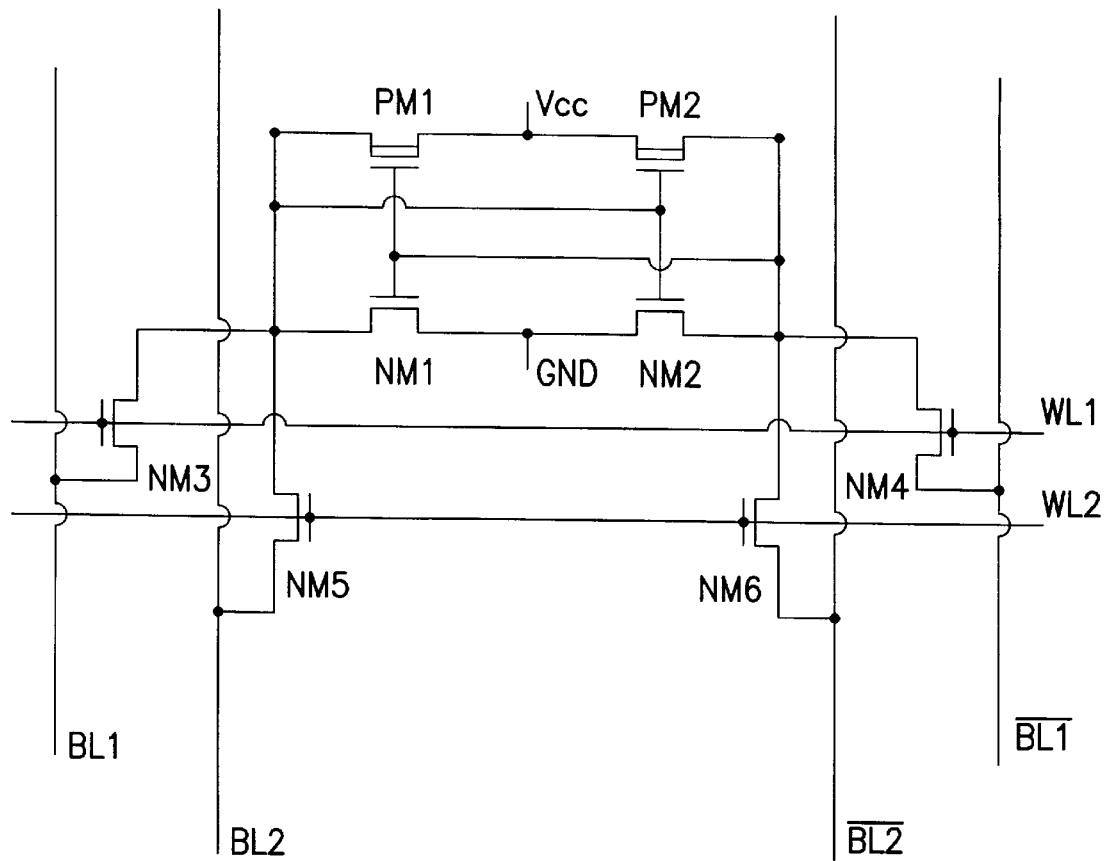
FIG. 1 shows a circuit diagram of a conventional dual port SRAM.
Figure 2:
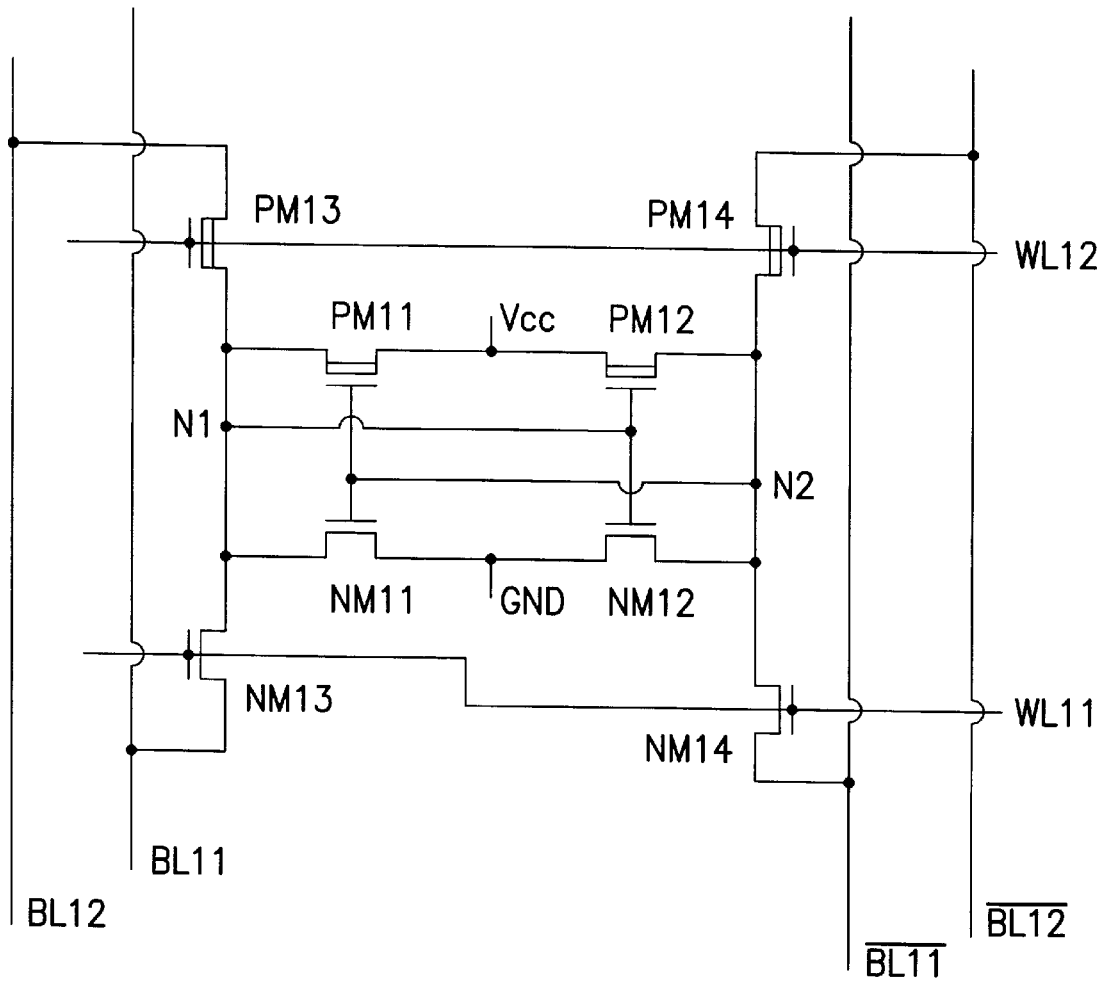
FIG. 2 shows a circuit diagram of a dual port SRAM in a preferred embodiment according to the invention.

In FIG. 2, a dual port SRAM comprises four NMOS transistors NM11 to NM14, and four PMOS transistors PM11 to PM14. Two NMOSs and two PMOSs are used as a pass gate of the dual port SRAM in the invention. In this example the NMOS transistor NM13, NM14, and the PMOS transistors PM13, PM14 are used as the pass gate.

As shown in the figure, the NMOS transistors NM13 has a gate connecting to a word line WL11, one source/drain region connecting to a bit line BL11, and the other source drain region connecting to a node N1. The NMOS NM14 has a gate connecting to the word line WL11, one source/drain region connecting to the other bit line $\overline{BL11}$, and the other source/drain region connecting to a node N2. The NMOS NM11 has a gate connecting to the node N2, a source/drain region connecting to ground, and the other connecting the node N1. The NMOS NM12 has a gate connecting to the node N1. one source/drain region connecting to ground, and the other source/drain connecting to the node N2. The PMOS PM13 has a gate connecting to a word line WL12, a source/drain region connecting to a bit line BL12, and the other source/drain region connecting, to the node N1. The PMOS PM14 has a gate connecting to the word line WL12, a source/drain region connecting to a bit line $\overline{BL12}$, and the other source/drain region connecting to the node N2. The PMOS PM11 has a gate connecting to the node N2, a source/drain region connecting to a power source Vcc, and the other source/drain region connecting to the node N1. The PMOS PM12 has a gate connecting to the node N1, a source/drain region connecting to the power source Vcc, and the other source/drain region connecting to the node N2. The bit line $\overline{BL11}$ is complementary to the bit line BL11, while the bit line $\overline{BL12}$ is complementary to the bit line BL12.

While writing data to or reading data from the bit lines BL12 and $\overline{BL12}$, the word line WL12 is biased with a low voltage to turn on the PMOS transistors PM13 and PM14. Whereas, to write data to or to read data from the bit lines BL11 and $\overline{BL11}$, a voltage high enough to turn on the NMOS transistors NM13 and NM 14 is applied to the word line WL11.

In addition to the identical number of the NMOS transistors and PMOS transistors the word lines WL11 and WL12, the bit lines BL11, BL12 and the bit lines $\overline{BL11}, \overline{BL12}$ are symmetric to each other.

Figure 3:
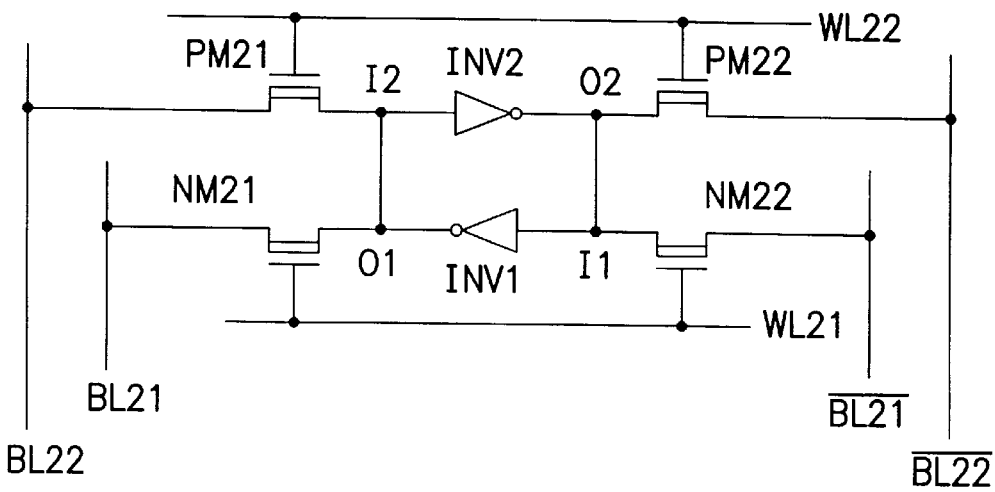
FIG. 3 shows a circuit diagram of a dual port SRAM in another preferred embodiment according to the invention.

FIG. 3 shows another embodiment of the invention. In this embodiment, two inverters INV1, INV2 are added in addition to two NMOS transistors NM21, NM22 and two PMOS transistors PM21, PM22.

In FIG. 3, the inverter INV1 has a first input terminal I1 and a first output terminal 01, while the inverter INV2 has a second input terminal I2, and a second output terminal 02. The input terminal I2 is connected to the output terminal 01, and the input terminal I1 is connected to the second output terminal 02. The NMOS NM21 has a gate connecting to a word line WL21, a source/drain region connecting to a bit line BL21, and the other source/drain region connecting to the first output terminal 01. The NMOS NM22 has a gate connecting to the word line WL21, a source/drain region connecting to a bit lint $\overline{BL21}$, and the other source/drain region connecting to the first input terminal I1. The PMOS PM21 has a gate connecting to a word line WL22, a source/drain region connecting to a bit line BL22, and the other source/drain region connecting to the second input terminal I2. The PMOS PM22 has a gate connecting to the word line WL22, a source/drain region connecting to a bit line $\overline{BL22}$, and the other source/drain region connecting to the second output terminal 02.

Each device in the circuit shown in FIG. 3 has a functionally corresponding device in the circuit shown in FIG. 2. For example, the inverter INV1 is equivalent to combination of the NMOS NM11 and the PMOS PM11. The inverter INV2 is equivalent to the combination of the NMOS NM12 and the PMOS PM 12. The NMOS NM21. NM22, the PMOS PM21, PM22 are corresponding to the NMOS NM13, NM14, and the PMOS PM 13, PM14, respectively. In addition, the node N1 is equivalent to the first output terminal 01 and the second input terminal I2, while the node N2 is corresponding to the second output terminal 02 and the first input terminal I2. Each of the bit lines BL21, $\overline{BL21}$, BL22, $\overline{BL22}$ is respectively corresponding to the bit lines BL11, $\overline{BL11}$, BL12, $\overline{BL12}$, and the word line WL21 and WL22 are corresponding to the word line WL11, WL12. The operation of the circuit shown in FIG. 3 is thus not described again.

In the dual port SRAM shown in FIG. 3, the NMOS NM21, NM22, the PMOS PM21. PM22 are used as a pass gate. Furthermore, the symmetric layout of the dual port SRAM is compatible to the requirement of a memory with high density and high capacity due to a high package density.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A dual port static random access memory, comprising:
   a first inverter, comprising a first input terminal and a first output terminal;
   a second inverter, comprising a second input terminal connecting to the first output terminal and a second output terminal connecting to the first input terminal;
   a first N-type MOS transistor, comprising a gate connecting to a first word line, a source/drain region connecting to a first bit line, and the other source/drain region connecting to the first output terminal;
   a second N-type MOS transistor, comprising a gate connecting to the first word line, a source/drain region connecting to a second bit line, and the other source/drain region connecting to the first input terminal;
   a first P-type MOS transistor, comprising a gate connecting to a second word line, a source/drain region connecting to a third bit line, and the other source/drain region connecting to the second input terminal; and
   a second P-type MOS transistor, comprising a gate connecting to the second word line, a sourirce/drain region connecting to a fourth bit line, and the other source/drain region connecting to the second output terminal.

2. The dual port static random access memory according to claim 1, wherein the first inverter comprises:
   a third P-type MNOS transistors comprising a gate connecting to the first input terminal, a source/drain region connecting to a power source, and the other source/drain region connecting to the first output terminal; and
   a third N-type MOS transistor, comprising a gate connecting to the first input terminal, a source/drain region connecting to ground, and the other source/drain region connecting to the first output terminal.

3. The dual port static random access memory according to claim 2, wherein the second inverter comprises:
   a fourth P-type MOS transistor, comprising a gate connecting to the second input terminal, a source/drain region connecting to the power source, and the other source/drain region connecting to the second output terminal, and
   a fourth N-type MOS transistor, comprising a gate connecting to the second input terminal, a source/drain region connecting to the ground, and the other source/drain region connecting to the second output terminal.

4. A dual port static random access memory, comprising:
   a first N-type MOS transistor, comprising a gate connecting to a first word line, a source/drain region connecting to a first bit line, and the other source/drain region connecting to a first node:

a second N-type MOS transistor, comprising a gate connecting to the first word line, a source/drain region connecting to a second bit line, and the other source/drain region connecting to a second node;

a third N-type MOS transistor, comprising a gate connecting to the second node, a source/drain region connecting to ground, and the other source/drain region connecting to the first node;

fourth N-type MOS transistor, comprising a gate connecting to the first node, a source/drain region connecting to the ground, and the other source/drain region connecting to the second node, a first P-type MOS transistor, comprising a gate connecting to a second word line, a source/drain region connecting to a third bit line, and the other source/drain region connecting to the first node;

a second P-type MOS transistor, comprising a gate connecting to the second word line, a source/drain region connecting to a fourth bit line, and the other source/drain region connecting to the second node;

a third P-type MOS transistor, comprising a gate connecting to the second node, a source/drain region connectinig to a power source, and the other source/drain region connecting to the first node; and a fourth P-type MOS transistor, comprising a gate connecting to the first node, a source/drain region connecting to the power source, and the other source/drain region connecting to the second node.

5. The dual port static random access memory according to claim 4, comprising a pass gate which includes a same number of the N-type MOS transistors selected from the first to the fourth N-type MOS transistors and the P-type transistors selected from the first to the fourth P-type MOS transistors.

6. The dual port static random access memory according to claim 5, wherein two N-type MOS transistors are selected with two of the first to the fourth bit lines as first pass gates, and two P-type MOS transistors are selected with the other two of the first to the fourth bit lines as second pass gates.

* * * * *